United States Patent [19]
Schatz et al.

[11] Patent Number: 5,845,270
[45] Date of Patent: Dec. 1, 1998

[54] MULTIDIMENSIONAL INPUT-OUTPUT MODELING FOR ORGANIZING INFORMATION

[75] Inventors: Joel Schatz, San Francisco, Calif.; Marc Baber, Eugene, Oreg.

[73] Assignee: Datafusion, Inc., San Francisco, Calif.

[21] Appl. No.: 735,438

[22] Filed: Jan. 2, 1997

Related U.S. Application Data

[60] Provisional application No. 60/009,545 Jan. 2, 1996.
[51] Int. Cl.$^6$ .............................. G06F 17/50; G06F 15/00
[52] U.S. Cl. ............................ 706/11; 706/53; 345/440
[58] Field of Search .......................... 395/140, 12, 349, 395/62, 63; 364/578; 706/53, 11; 345/440

[56] References Cited

U.S. PATENT DOCUMENTS

| | | | |
|---|---|---|---|
| 5,101,340 | 3/1992 | Nonaka et al. | 395/701 |
| 5,195,178 | 3/1993 | Krieger et al. | 395/347 |
| 5,212,771 | 5/1993 | Gane et al. | 395/357 |
| 5,216,592 | 6/1993 | Mann et al. | 395/208 |
| 5,228,117 | 7/1993 | Fukui et al. | 395/62 |
| 5,233,688 | 8/1993 | Too | 395/140 |
| 5,241,645 | 8/1993 | Cimral et al. | 395/500 |
| 5,379,366 | 1/1995 | Noyes | 395/12 |
| 5,414,809 | 5/1995 | Hogan et al. | 395/349 |
| 5,500,800 | 3/1996 | Talbott | 395/62 |
| 5,537,524 | 7/1996 | Aprile | 395/140 |

OTHER PUBLICATIONS

Kosak C., et al., "Automating The Layout of Network Diagrams with Specified Visual Organization," IEEE Transactions on Systems, Man and Cybernetics, vol. 24, No. 3, Mar. 1, 1994, pp. 440–454.

"Layout Algorithm for Computer Network Management Graphics," IBM Technical Disclosure Bulletin, vol. 30, No. 12, May 1, 1988, pp. 268–277.

Frezza, S.T., et al., "SPAR: A Schematic Place and Route System," IEEE Transactions on Computer Aided Design of Integrated Circuits and Systems, vol. 12, No. 7, Jul. 1, 1993, pp. 956–972.

Patent Abstracts of Japan, vol. 017, No. 189 (P–1521), Apr. 13, 1993 & JP 04 340129 A (NEC Corp), Nov. 26, 1992.

Y. Chen and Y. Usuda, "EUOBFE—An End User Oriented CASE Tool for Business Process Reengineering," Proc. Eighteenth Annual Int'l. Computer Software and Applications Conf. pp. 346–351, Nov. 1994.

C. O'Malley, "Charts bring clarity to your data," Computer Shopper, vol. 15(6), pp. 446(2)., Jun. 1995.

R.L. Moore, et al., "Process Control Using the G2 Real–Time Expert System," Industry Applications Society Annual Meeting, vol. 2, pp. 1452–1456, Oct. 1989.

R.L. Moore, "G2: A Software Platform for Intelligent Process Control," Proc. 1991 IEEE Int'l. Symposium on Intelligent Control, pp. 1–5, Aug. 1991.

*Primary Examiner*—Robert W. Downs
*Attorney, Agent, or Firm*—Blakely, Sokoloff, Taylor & Zafman, LLP

[57] ABSTRACT

A computer implemented method for defining, organizing, and analyzing systems and the connections, or relationships, between the systems, in a flexible manner according to a user's focus, perspective, and desired level of detail. A set of systems is selected by a user. A set of attributes by which to distinguish the systems is selected by the user. The systems are grouped according to the values for the selected attributes, thereby forming a taxonomy tree. A user then selects one or more resources that are potentially produced by, i.e., flow from, or consumed by, i.e., flow to, one or more of the systems of interest. A hypercube data structure is created that defines between which systems the resources flow. Utilizing the taxonomy tree, the hypercube further summarizes resource flows between parent systems for which resource flows are defined between their corresponding child systems. A network diagram is then constructed utilizing the taxonomy tree and the hypercube, in which systems are depicted as nodes and the resources flowing between the systems are depicted as pipes or arrows connecting the nodes.

6 Claims, 6 Drawing Sheets

FROM SYSTEMS

| | S1 | S2 | S3 | S4 | S5 | S6 | S7 | S8 | S9 | S10 | S11 | S12 | S13 | S14 | S15 | S16 | S17 | S18 | S19 | S20 | S21 | S22 | S23 | S24 | S25 | S26 |
|---|---|---|---|---|---|---|---|---|---|---|---|---|---|---|---|---|---|---|---|---|---|---|---|---|---|---|
| S1 | F | F | F | F | F | F | F | F | F | T | T | F | F | T | F | T | F | T | T | T | F | F | F | F | F | F |
| S2 | F | F | F | F | F | F | F | F | F | F | F | F | F | F | F | T | F | T | T | F | F | F | F | F | F | F |
| S3 | F | F | F | F | F | F | F | F | F | F | F | F | F | F | F | T | F | T | T | F | F | F | F | F | F | F |
| S4 | | | | | | | | | | | | | | | | | | | | | | | | | | |
| S5 | T | T | | | | | | | | | | | | | | T | | | T | | | | | | | |
| S6 | T | T | | | | | | | | | | | | | | T | | | T | | | | | | | |
| S7 | | | | | | T | | | | | | | | | | | | | | | | | | | | |
| S8 | | | | | | | | | T | T | | T | | | | | | | | | | | | | | |
| S9 | | | | T | | T | T | | | | | | | | | | | | | | | | | | | |
| S10 | | | | | | | | | | | | | | | | | | | | | | | | | | |
| S11 | | | | | | | | | | | | | | | | | | | | | | | | | | |
| S12 | | | | | | | | | | | | | | | | | | | | | | | | | | |
| S13 | | | | | | | | | | | | | | | | | | | | | | | | | | |
| S14 | | | | | | | | | | | | T | T | | | | | | | | | | | | | |
| S15 | | | | | | | | | | | | | | | | | | | | | | | | | | |
| S16 | | | | | | | | | | | | | | | | | | | | | T | | T | T | | T |
| S17 | | | | | | | | | | | | | | | | | | | | | T | | T | T | | |
| S18 | | | | | | | | | | | | | | | | T | | | | | T | | T | T | | |
| S19 | | | | | | | | | | | | | | | | T | | | | | T | | T | T | | |
| S20 | | | | | | | | | | | | | | | | | | | | | T | | | | | T |
| S21 | | | | | | | | | T | | | | | T | | | | | | | | | | | | |
| S22 | | | | | | | | | | | | | | | | | | | | | | | | | | |
| S23 | | | | | | | | | | | | | | | | | | | | | | | T | | | |
| S24 | | | | | | | | | | | | | | | | | | | | | | | T | | | |
| S25 | | | | | | | | | | | | | | | | | | | | | | | | | | |
| S26 | | | | | | | | T | | | | | T | | | | | | | | | | | | | |

TO SYSTEMS (Y), X →, 300

MULTIDIMENSIONAL INPUT-OUTPUT MODELING FOR ORGANIZING INFORMATION

CROSS REFERENCE TO RELATED APPLICATIONS

This nonprovisional patent application claims the benefit of U.S. Provisional Application No. 60/009,545, filed Jan. 2, 1996, entitled, "METHOD AND APPARATUS FOR INTEGRATING HETEROGENEOUS DATA."

STATEMENT REGARDING FEDERALLY SPONSORED RESEARCH OR DEVELOPMENT

Not Applicable.

BACKGROUND OF THE INVENTION

1. Field of the Invention

The present invention is related to the fields of general systems modeling and information management software. More specifically, the present invention provides a computer implemented method for defining, organizing, and analyzing systems and the connections, or relationships, between the systems, in a flexible manner according to a user's focus, perspective, and desired level of detail.

2. Description of the Related Art

The present invention utilizes a directed graph, or network diagram, as a means for a user to view and interpret relationships among systems, for example, input/output relationships between systems. Many disciplines utilize network diagrams, in which a system is depicted by a node and a relationship between two nodes is indicated by a connection between nodes, typically represented by a line or an arrow. For example, in the field of telecommunication or data communication networks, a network diagram is utilized to represent the topology of the network. Additionally, in the field of computer science, state transition (network) diagrams are utilized to represent finite state machines and computer programs. Economists use network diagrams for input-output analysis in connection with tracking the flow of currency, goods, services, etc., in an economic model. As a final example, in the field of electrical engineering, circuit diagrams are essentially network diagrams illustrating, e.g., the flow of current through electrical components and wiring.

While the use of network diagrams is quite common in various disciplines, there are a number of shortcomings associated with their use. For example, network diagrams generally do not provide context, i.e., the systems they represent may be defined by somewhat arbitrary and limited boundaries, especially for interdisciplinary fields of use. What is needed is a potentially universal context into which all systems and network diagrams can be organized according to possibly diverse attributes.

Moreover, existing tools for designing and displaying network diagrams do not provide the ability for a particular user to fine tune the level of detail displayed in the network diagram. What is needed is a method for a user to define a unique classification or taxonomy of the systems and/or resources of interest to control the level of detail desired in the network diagram.

Prior art network diagrams are also limited by an underlying aggregation scheme. For example, the information upon which a network diagram is based may be maintained according to a national categorization scheme whereas a network diagram based on an industrial or some other categorization or classification scheme may be desired. It is difficult to reconcile the information in the two different network diagrams. What is needed is the ability to quickly and easily categorize the same set of information according to different attributes selected by a user to produce different network diagrams of systems and resource flows between the systems.

Finally, while many network diagrams house vast amounts of useful information requiring large investments of time and money to create, there is generally no effective or efficient re-use of the information, or ability to systematically interconnect two or more separate network diagrams. Moreover, many real world problems arise when problems and models are too narrowly defined and thus overlook unintended side effects or fail to discover simpler, more effective solutions that can, perhaps, be conceived by tracing problems back to their sources or by breaking the weakest link in a negative feedback loop. Thus, what is needed is a method by which network diagrams are accessible, re-useable and can be interconnected, so that users may view systems of interest in the broadest possible context, e.g., a global or universal context.

BRIEF SUMMARY OF THE INVENTION

The present invention provides a method by which system objects and resource objects, and the relationships between the system objects and resource objects, are organized and summarized. The system objects, resource objects and relationships between the same may be utilized to create a network diagram for graphical analysis of the relationships between the system objects and resource objects. A user selects system objects from a plurality of classes, and selects attributes associated with the plurality of classes to organize the system objects. The system objects are then organized into groups according to the attributes. Resource objects potentially produced or consumed by the system objects are selected and the groups into which and out of which the resource objects potentially flow are identified. The resource objects and the groups are organized in such a manner so as to identify between which groups and in what direction the resources flow. The system objects and resource objects are depicted in a network diagram as may be useful, e.g., in input/output modeling or analysis. It is another object of the present invention to provide a method for interconnecting two or more network diagrams to form a single merged network diagram.

BRIEF DESCRIPTION OF THE SEVERAL VIEWS OF THE DRAWINGS

The present invention is illustrated by way of example and not limitation in the following figures. Like references indicate similar elements, in which.

DETAILED DESCRIPTION OF THE INVENTION

Described is a computer implemented method for defining, organizing, and analyzing systems and the relationships between the systems in a flexible manner according to criteria input by a user to select the systems, attributes associated with the systems, and resource flows between the systems. In the following description, numerous specific details are set forth in order to provide a thorough understanding of the present invention. However, it will be apparent to one of ordinary skill in the art that the present invention may be practiced without these specific details. In other instances, well-known structures, architectures, and techniques have not been shown to avoid unnecessarily obscuring the present invention. In particular, data structures presented herein are commonly associated with Relational Database Management Systems (RDBMS) and multidimensional databases. While these database management technologies are used for the purpose of explaining the present invention, it is likely that other functionally similar technologies may be utilized by the present invention, including Object Oriented Database Management Systems (OODMS), hierarchical database management systems, C++ collection classes or data structures implemented using C++, smalltalk, JAVA or other suitable programming languages.

Definitions

A review of the following terms is useful for an understanding of the invention.

Aggregate: combination of items considered a unit. For example, an aggregate of several systems comprises an aggregate system that appears as a single node or box in a network diagram. Likewise, several resources combined together are an aggregate resource that appear as a single line or pipe between two nodes in the network diagram.

Assertion: a logical expression set up as a barrier or filter in a computer program to prevent erroneous results by halting execution of part of all of the computer program when the expression does not evaluate to true. In the context of the taxonomy tree described herein, an assertion is a logical expression of attributes that prevents a system from being included in an aggregate in which it does not belong.

Atomic: indivisible unit. For example, an atomic object is indivisible. The attribute table contains no sub-objects for an atomic object. The term may be used to describe a system object or resource object.

Attribute: quality, measurement or other characteristic such as name, identifier or location, of an object. An attribute is a data member of an object or a column in an attribute table. Attributes are used in a taxonomy to divide objects into separate groups. For example, in the class "rivers", the object "Amazon" has attributes such as length, average width, average depth, rate of flow, etc.

Attribute Expression: a logical expression of attributes, functions (often polymorphic) of one or more attributes, and constants, combined with logical operators such as OR, AND, NOT, XOR (exclusive - OR), and other related set-defining operators that may be found in database Structured Query Language (SQL) family expression languages.

Backdrop: rectangular element or the like in a network diagram which is positioned logically behind or around a box or group of related boxes or nodes. The backdrop represents a group related to a subgroup which in turn can be represented by a box positioned logically in front of or within the backdrop in the network diagram.

Cell: a location defined by the intersection of a row and column in a table, at which a value may be stored. Similarly, in a three or more dimensional table or hypercube, a cell is a single location in the hypercube with known indices in all dimensions at which a value may be stored. In a hypercube indexed by aggregate systems, a cell may store an attribute expression rather than, e.g., a single boolean value of true or false.

Class: in Object Oriented Programming (OOP), objects which share the same behavior and data elements belong to the same class. A class is a generic specification or definition for a group of related or similar objects, e.g., the class "rivers" includes the objects Amazon, Missouri, Mississippi, Nile, etc.

Class Hierarchy: a mapping of class definitions. The class hierarchy identifies the relationship of a class with respect to other classes in the class hierarchy. Thus, a class lower in the hierarchy inherits part of its definition from one or more classes above it in the hierarchy.

Criterion: each non leaf node in a user defined taxonomy tree contains information, e.g., a specific attribute associated with the node and/or its child nodes, that provides the basis for dividing the node into two or more child nodes, according to the different values assigned to the criterion attribute in each of the child nodes.

Dynamic Hierarchical Organization (DHO): organization of information that permits systems to be organized into arbitrary hierarchies according to a user defined taxonomy. DHO provides flexibility in the analysis of the systems and relationships between systems.

Dimension: in a multidimensional database, this term refers to an attribute that can be sliced to reveal or added to provide detailed information in the dimension for objects. In a relational database, this term equates to a column.

Hypercube: an n dimensional representation of information as may be utilized when analysis of the information requires any combination of dimensions to be compared against the other. The hypercube can be rotated depending on the desired analysis to present the information of interest.

Instance: an object that corresponds to or is a specific example of a class is referred to as an instance of that class. Whereas a class is a general definition, an instance is a specific object that meets the definition.

Object: an instance of a class.

Overlay: a criterion and a set of assertions about the criterion that, taken together, completely cover the entire possible domain of the associated criterion and do not overlap, assuring that each system classified by the overlay is mapped to one and only one branch in the taxonomy tree.

Resource Object (Resource): an object representing anything that might be considered to flow from one system to another system, e.g., raw materials, food, energy, money, information. A resource flow produces a measurable effect on one or more systems upon which analysis is performed. A resource is represented by a "pipe" or arrow between systems represented as nodes in a network diagram embodied by the present invention.

System Object (System): an object or aggregation of objects in the real world that consumes or produces one or more resources. A collection of subsystems.

Systems Hierarchy: a taxonomy tree of atomic and aggregate system objects in which each system object is represented by a node in the tree and in which each non-leaf node at each level in the tree is associated with an overlay. Generally, a given criterion occurs only once in any branch of the tree, unless a second occurrence of the same criterion further differentiates the sub-domain resulting from the prior overlay's assertion for that branch.

Table: items sharing the same attributes organized into rows, or records, and columns.

Taxonomy: A set of overlays organized as a hierarchical tree, which imposes a user's abstraction of relationships among systems for the purpose of a particular analysis. A taxonomy is applied to a set of systems to sort them into groups for the particular analysis. The taxonomy, together with the systems themselves, determines the nodes and the relationship between the nodes in the network diagram of the present invention. Generally, there is one node for each leaf in the taxonomy tree, the only exception being when no systems map to a given leaf and its corresponding node is omitted.

Hardware Overview

Figure 6:
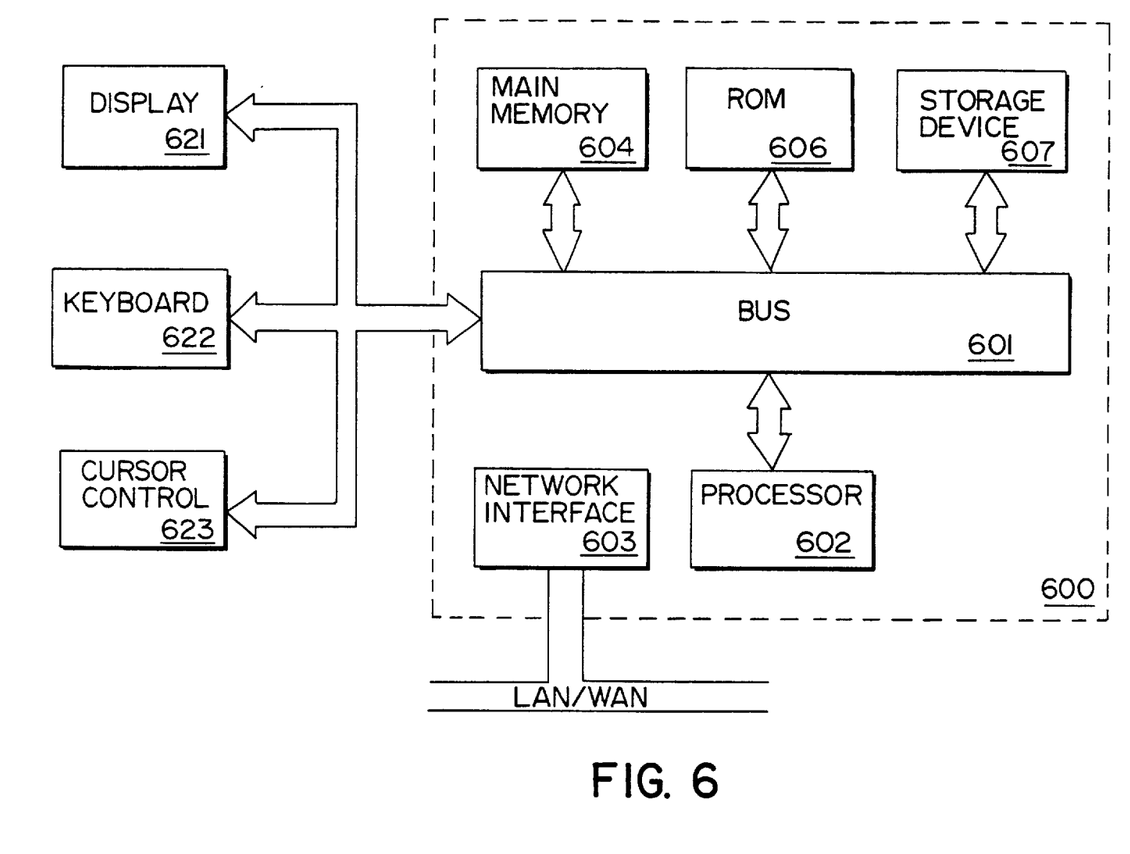
FIG. 6 is a block diagram of a computer system as may be utilized by the present invention.

Referring to FIG. 6, a computer system upon which the preferred embodiment of the present invention can be implemented is shown as 600. System 600 comprises a bus or other communication means 601 for communicating information, and a processing means 602 coupled with bus 601 for processing information. Processing means 602 may be comprised of one or more processors. System 600 further comprises a random access memory (RAM) or other dynamic storage device 604 (referred to as main memory), organized as either shared memory or distributed memory if in a multiprocessor architecture, coupled to bus 601 for storing information and instructions to be executed by processor 602. Main memory 604 also may be used for storing temporary variables or other intermediate information during execution of instructions by processor 602. Computer system 600 also comprises a read only memory (ROM) and/or other static storage device 606 coupled to bus 601 for storing static information and instructions for processor 602. Data storage device 607 is coupled to bus 601 for storing information and instructions.

A data storage device 607 such as a magnetic disk or optical disk and its corresponding disk drive can be coupled to computer system 600. Computer system 600 can also be coupled via bus 601 to a display device 621, such as a cathode ray tube (CRT), head mounted display, etc., for displaying information to a computer user. An alphanumeric input device 622, including alphanumeric and other keys, is typically coupled to bus 601 for communicating information and command selections to processor 602. Another type of user input device is cursor control 623, such as a mouse, trackball, or cursor direction keys for communicating direction information and command selections to processor 602 and for controlling cursor movement on display 621. This input device typically has two degrees of freedom in two axes, a first axis (e.g., x) and a second axis (e.g., y), which allows the device to specify positions in a plane. Additionally, the input device 623 may have three degrees of movement such as a three-dimensional spaceball device and may be utilized to specify positions along, e.g., three axes such as an x, y and z axis.

Alternatively, other input devices such as a stylus or pen can be used to interact with the display. A displayed object on a computer screen can be selected by using a stylus or pen to touch the displayed object. The computer detects the selection by implementing a touch sensitive screen. Similarly, a light pen and a light sensitive screen can be used for selecting a displayed object. Such devices may thus detect selection position and the selection as a single operation instead of the "point and click," as in a system incorporating a mouse or trackball. Stylus and pen based input devices as well as touch and light sensitive screens are well known in the art. Such a system may also lack a keyboard such as 622 wherein all interface is provided via the stylus as a writing instrument (like a pen) and the written text is interpreted using optical character recognition (OCR) techniques.

In the currently preferred embodiment of the invention, computer system 600 is configured to execute a database application. Computer system 600 may be one of many computer systems accessing data stored in the same database, which may be centralized or distributed. Each of the computer systems may be executing one or more transactions.

The mechanisms of a database management system execute by using memory structures and processes. The memory structures exist in main memory 604 of computer system 600. It should be noted that in a distributed database management system, the memory structures may exist in the main memory of one or more computer systems that constitute the database management system. Processes are jobs or tasks performed by processors in response to executing sequences of instructions stored in the memory of the computer systems.

Finally, in the currently preferred embodiment of the invention, computer system 600 is configured with a network interface 603 for coupling computer system 600 to a data communications network such as a corporate intranet, the Internet or World Wide Web graphical portion of the Internet.

Class Hierarchy

Figure 1:
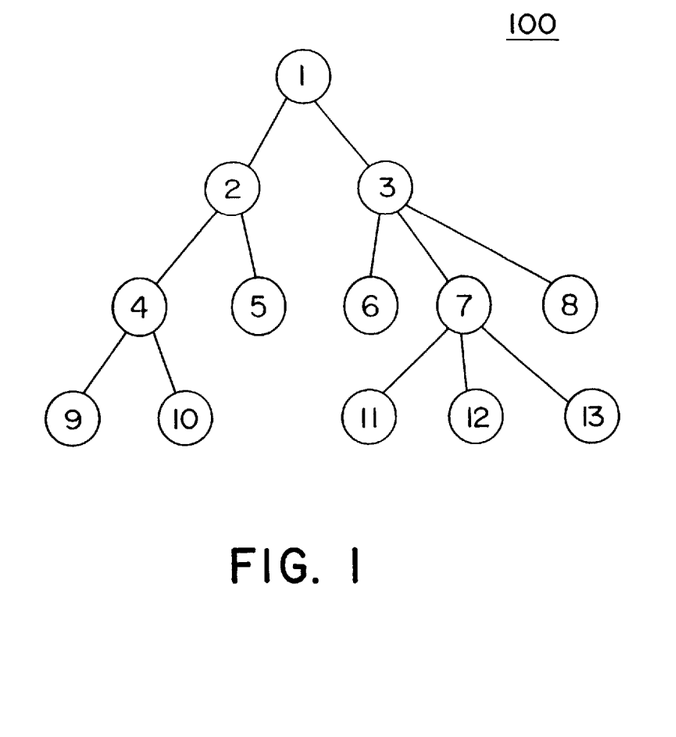
FIG. 1 illustrates a class hierarchical structure as utilized by the present invention.

In the preferred embodiment of the present invention, each class definition in a class inheritance hierarchy structure such as class inheritance hierarchy structure 100 as illustrated in FIG. 1 represents the definition for a class of system objects, hereafter referred to as simply systems. Each child class inherits the attributes of its parent classes and adds distinguishing attributes that differentiate it from sibling, or peer, classes.

Attribute Table

Figures 2A, 2B:
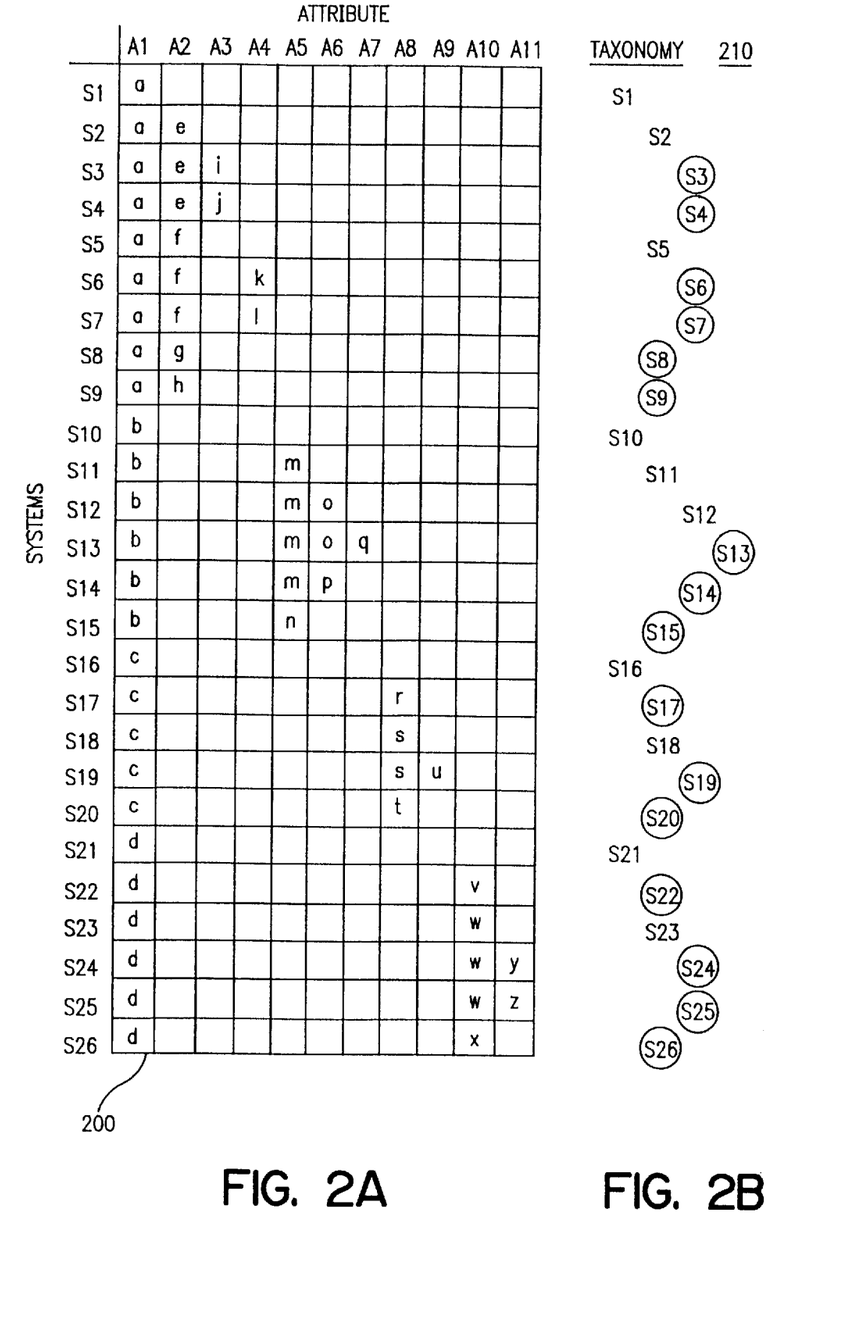
FIG. 2A is a diagram of an attribute table defining attributes associated with user selected objects from the classes in the structure of FIG. 1.
FIG. 2B is an outline illustrating the hierarchical nature of the objects in the attribute table defined according to the attributes associated with those objects.

Given a class hierarchy structure 100 and a dataset of objects that are instances of one or more classes in class hierarchy structure 100, according to the present invention, a user selects from the dataset a set of instances from one or more classes of systems of interest as defined by the structure 100. With reference to FIG. 2A, an attribute table 200 is then constructed comprising the selected systems and attributes associated with all such systems. Table 200 may be created using, for example, a relational database management system operating on computer system 600. Systems are organized into rows in the attribute table, where each row is either an aggregate system or an atomic system. Within table 200, aggregate systems may be outdented relative to their sub-systems, while atomic systems may be indented relative to their parent systems.

For example, table 200 comprises systems S1 through S26 representing systems selected by the user from a dataset comprising systems corresponding to the class definitions in class hierarchy structure 100. It is appreciated that for practical reasons, table 200 may be implemented using a object oriented database (OODB) that avoids well known problems associated with sparse tables.

Given a set of attributes representing all of the attributes associated with all of the class definitions in structure 100, in which no attribute is associated with different systems unless it has precisely the same meaning for both systems and these systems can be meaningfully compared using the common attribute, the user selects attributes from the set of attributes by which to separate the systems in attribute table 200 into groups, and the groups into subgroups, and so on. The attributes selected are organized into columns in the attribute table. Table 200, for example, comprises attributes A1 through A11, wherein each attribute is defined for at least one system and is used to distinguish the system from other systems in the table.

Systems in table 200 which share a given attribute are separated into different groups depending on the value of the attribute. For example, attribute A1 is shared by all systems (S1–S26) in table 200. Attribute A1 may have a value of a, b, c or d. Accordingly, systems S1 through S26 are organized in table 200 based on the values for attribute A1: systems S1–S9 share the value "a" for attribute A1, while systems S10–S15 share the value "b" for attribute A1, and so on. The cells corresponding to the intersection of a system and an attribute contain the value of the associated attribute.

Groups of systems in table 200 are further delineated into subgroups according to the value of additional attributes shared by the systems. In table 200, the group of systems S10–S15 whose associated attribute A1 has a value "b" is further decomposed into two groups of systems based on an additional attribute A2. Systems S11–S14 are a group whose attribute A5 has the value "m" and system S15 is a group whose attribute A5 has the value "n", as seen in FIG. 2B by the attribute values stored in the cells corresponding to systems S11–S15 and attribute A5. Systems S12–S14 are further divided by attribute A6 into a first group comprising systems S12 and S13, in which attribute A6 equals "o" and a second group comprising system S14, in which attribute A6 equals "p".

As can be seen, Table 200 is a sparse table in which many cells contain no specific value for a given attribute. Two special values may additionally be utilized in the table: NULL and N/A. The value NULL indicates that an attribute may be meaningful for a system in question, that is, the attribute exists in the class definition for the system. However, NULL indicates the specific value of the attribute is presently unknown. For example, an attribute "telephone number" may exist for the class "person", but the value of the telephone number for a specific instance of the class "person", i.e., a system object that is a member of the class "person", may be NULL if the phone number for the system is unlisted or is presently unknown. The value N/A indicates that an attribute is not applicable with respect to the class of which a system is a member, such as the price-to-earnings ratio of an ocean or the engine displacement of a population of geese.

It is appreciated that table 200 is dynamic depending on user selected criteria although the systems and attributes shared by systems remain consistent. As can be seen with reference to FIGS. 2A and 2B, at any given time, the contents of attribute table 200 define a taxonomy tree 210 or outline of the systems selected for analysis by the user. Subsystems in the tree 210 are distinguished from other subsystems of the same parent system by the value of a certain attribute or dimension. If a distinguishing attribute is not in the set of attributes, it is added as a column. Any distinguishing attributes of systems in newly added rows are added as columns if the attributes are not already present as columns in the table. It is further appreciated that while attribute table 200 is described with reference to system objects (systems), such a table may be used to create a classification, table or taxonomy tree of resource objects (resources) as well.

Drilling down, or traversing, from a parent system to one or more child systems at a lower level of aggregation in the taxonomy tree 210 augments a parent system of one class with a set of child systems of another class from a lower level of abstraction in the hierarchical structure 100. Child systems typically inherit most or all of the attributes shared by a parent system, and add one or more attributes shared only by the child systems descending from the parent system.

Table 200 defines the systems to be displayed in a network diagram representing, for example, an input/output analysis model. Each row or system in table 200 is a node in the network diagram. Circled systems in taxonomy tree 210 are systems from which no other systems descend and represent leaf nodes in a network diagram. Systems not circled in taxonomy tree 210 are systems from which at least one other system descends and thus, represent non leaf nodes in the network diagram. As will be discussed later, the network diagram may depict a node as a box or backdrop depending on whether the node is a leaf or non leaf node, respectively.

Hypercube Representation

Given a user defined taxonomy tree 210, data representing a resource flowing between the systems in the tree can be organized into a multidimensional database in which the systems between which a given resource potentially flows are indexed according to two dimensions. For example, with reference to FIG. 3, the systems S1–S26 are used to index both the X and Y axes. That is, each system occupies both a row and a column in multidimensional database 300. The intersection of a particular system in a row with another system in a column is represented by a cell. A value, for example, a boolean value, stored in the cell indicates whether a resource flows between the two intersecting systems.

Figure 3:
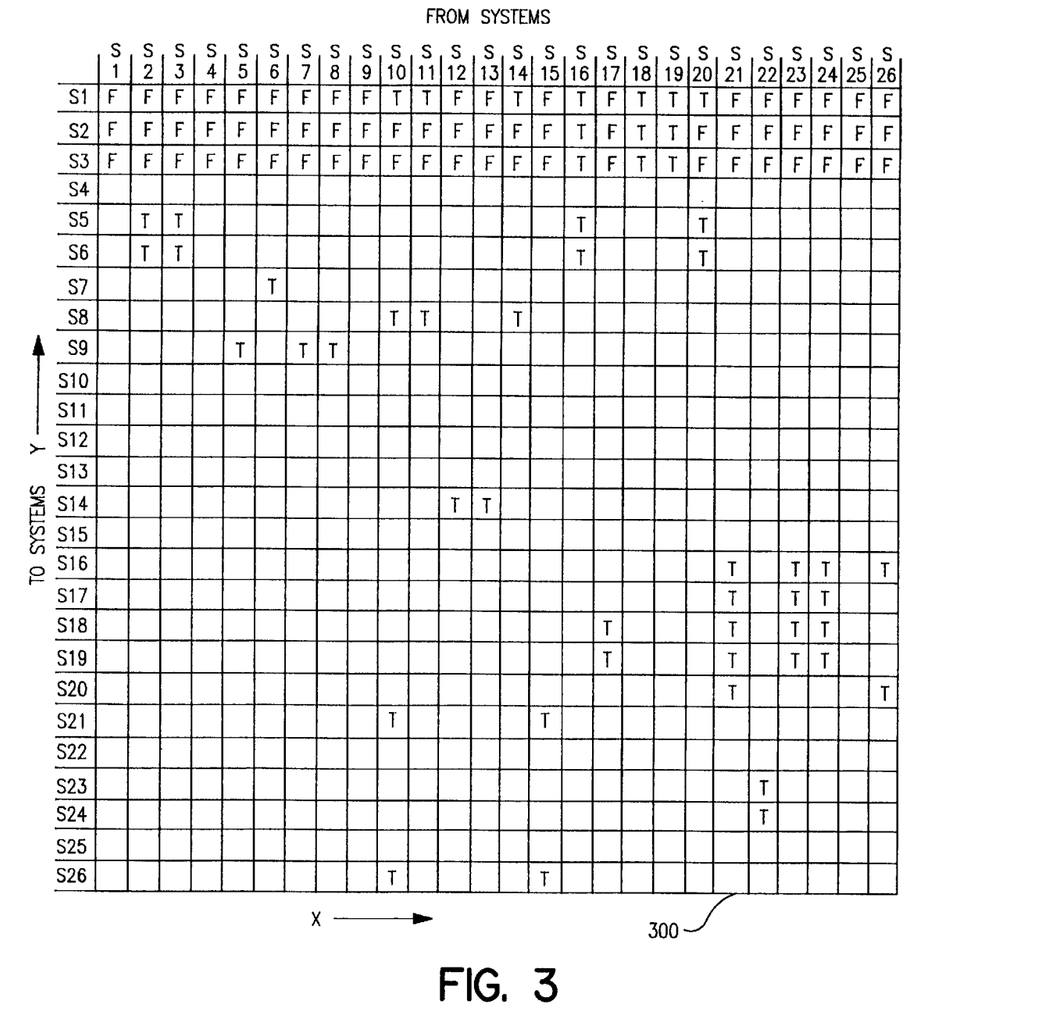
FIG. 3 is a multidimensional representation of the objects outlined in FIG. 2B and a single resource that potentially flows between the objects.

Given the database 300 of user selected system objects, a user then selects a resource object, hereafter referred to as a resource, from a set of resource objects organized either as a list, simple hierarchy or multidimensional hierarchy. For an input/output analysis model, the user then determines whether the selected resource flows from each particular system in database 300 to any other system in the database and indicates such flow exists by entering an appropriate value in the cell corresponding to the intersection of a row system and a column system. Flow direction is indicated by selecting one axis as a "from" axis and selecting the other axis as a "to" axis, determining the intersection of a system in the "from" axis (the "from system") with a system in the "to" axis (the "to system"), and entering a value such as the boolean value TRUE in the cell defined by the intersection of the from system and the to system.

For example, if the x axis in FIG. 3 represents the "from" axis and the y axis represents the "to" axis, the boolean value FALSE entered in the cell identified by the intersection of row 1, column 2 indicates the selected resource does not flow from system S2 to system S1. Likewise, the boolean value TRUE entered in the cell identified by the intersection of row 21, column 10 indicates the selected resource does flow from system 10 to system 21.

The multidimensional database 300 in FIG. 3 has a third dimension in addition to "from" systems along the x axis and "to" systems along the y axis. The selected resource represents a third dimension along the z axis. The example illustrated in FIG. 3 involves a single resource R1. However, with respect to FIG. 4, a hypercube 400 is illustrated, in which multiple resources along the z axis 403 are illustrated. The intersection of row 9 along the y axis (at 406), column 7 along the x axis (at 407), and column 1 along the z axis (at 408) defines a cell whose contents indicates whether a first selected resource (R1) flows from system S7 to system S9.

Figure 4:
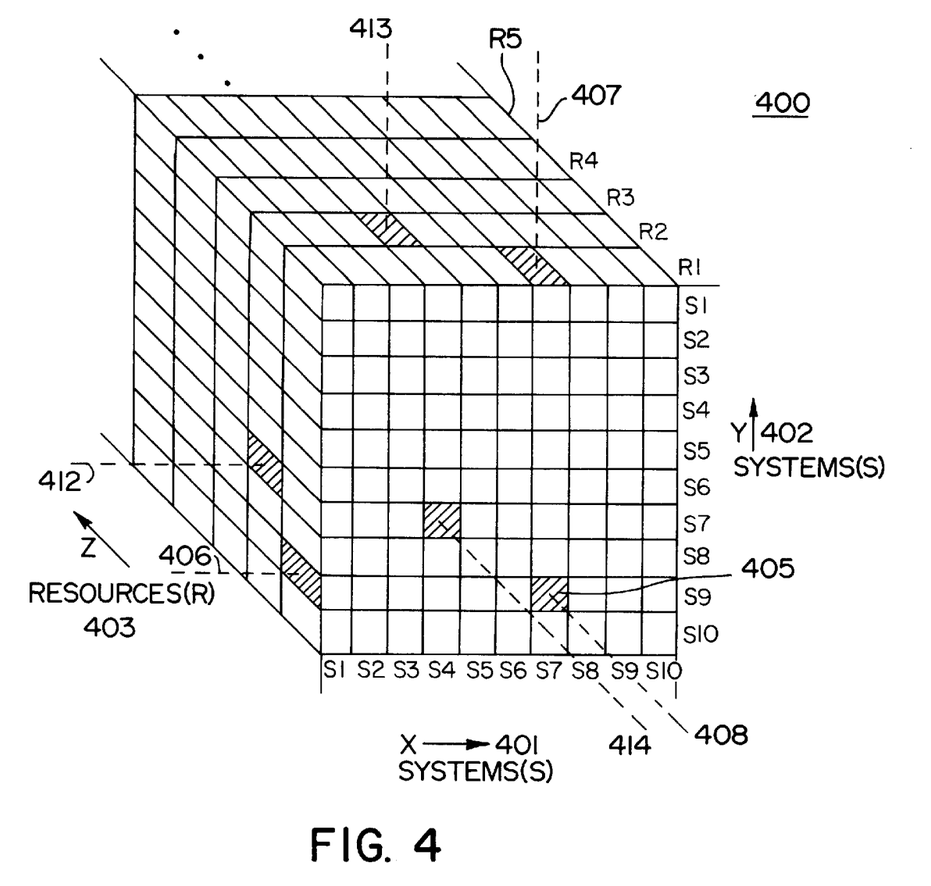
FIG. 4 is a hypercube representation of objects and potential resource flows of a number of different resources between such objects as embodied by the present invention.

Additionally, the intersection of row 7 along the y axis (at 412), column 4 along the x axis (at 413) and column 2 along the z axis (at 414) defines a cell (inside the hypercube and not visible on the surface) whose contents indicates whether a second selected resource (R2) flows from system S4 to system S7. Thus, it is appreciated that additional resources and/or subresources may be selected by the user, thereby expanding the hypercube along the z axis independently from the size of the cube in the x or y dimensions.

With reference again to FIG. 3, the use of a multidimensional database provides the ability to preconsolidate, or summarize, resource flows between systems at higher levels of aggregation. For example, from the taxonomy tree in FIG. 2B, it is seen that systems S15 and S26 are circled indicating they will represent leaf nodes in a network diagram of the selected systems. Additionally, inspection of the database 300 indicates there is a resource flow from system S15 to system S26, because the cell defined by the intersection of systems S15 and S26 has a value of TRUE. It is also seen with reference to FIG. 2B that system S15 is a child system of system S10, and system S26 is a child system of system S21. Systems S10 and S21 are not circled in FIG. 2B, indicating they will be represented as non leaf nodes in the network diagram. Thus, it is possible to indicate a resource flow exists between system S10 and S26 by entering the boolean TRUE in the cell at which the systems intersect in database 300. Indeed, a logical "or" operation is performed on the resource flows of child systems to determine and summarize the resource flows of corresponding parent systems. If a resource flow exists at a lower level in the taxonomy tree between two systems, then this resource flow will be reflected between the parent systems corresponding thereto, and so on, up the taxonomy tree until the "from" systems and "to" systems converge into a common ancestor node. As will be seen, this information is useful when constructing and navigating a network diagram for providing input/output analysis between systems.

Network Diagram

Given a taxonomy tree of systems as illustrated in FIG. 2B and a hypercube representation of resource flows between such systems as illustrated in FIG. 3, it is possible to then construct a network diagram for the purpose of, for example, performing input/output analysis on the selected systems. With respect to FIG. 5, a network diagram 500 is illustrated corresponding to the system hierarchy defined by the taxonomy tree in FIG. 2B and resource flows defined by the hypercube in FIG. 3.

For example, in the taxonomy tree, systems S3, S4 and S6–S9 are leaf nodes descending, either directly or indirectly from system S1. System S2 is a child system of system S1 and the parent system of systems S3 and S4. Likewise, system S5 is a child system of system S1 and the parent system of systems S6 and S7. Systems S8 and S9 are direct descendants of system S1. Thus, system S1 appears in FIG. 5 as a backdrop for systems S2, S5, S8 and S9, while systems S2 and S5 appear as backdrops for systems S3–S4 and S6–S7, respectively. The leaf nodes S3, S4, S6–S9 appear as nodes, or boxes layered on top of their respective backdrops. The other systems S10–S26 are mapped in network diagram 500 of FIG. 5 in the same manner.

Figure 5:
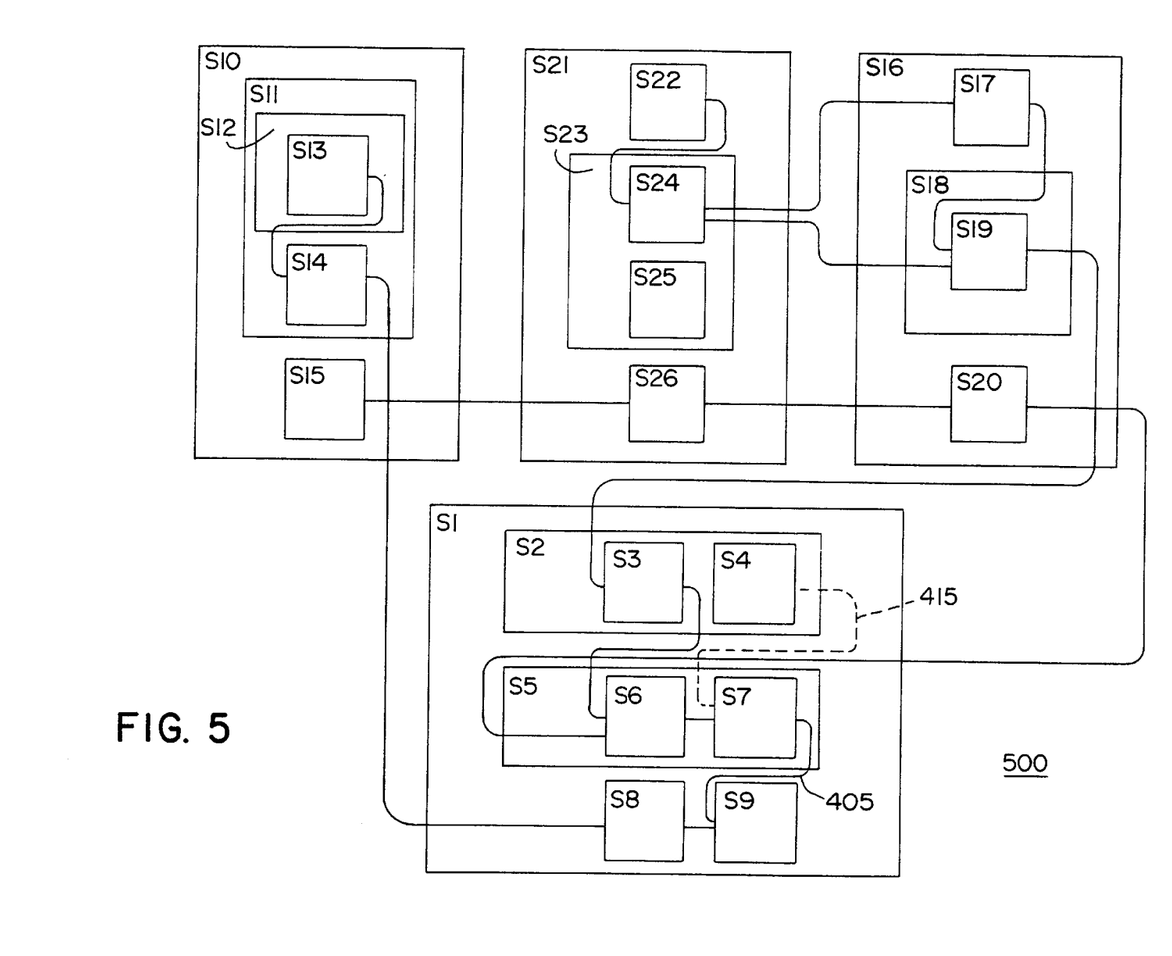
FIG. 5 is a network diagram as embodied by the present invention.

Next, data from the hypercube illustrated in FIG. 3 are utilized to define the lines, or pipes, representing resource flows between the systems in the network diagram of FIG. 5. Referring back to the previous example in which database 300 indicated a given resource flows from system S15 to system S26, a pipe is drawn between the two systems representing the resource flows. In the Figure, a resource is depicted as flowing from, or being produced by, a system by connecting the pipe to the right hand side of the box representing the system. Likewise, a resource is depicted as flowing to, or being consumed by, a system by connecting a pipe to the left hand side of the box representing the system. Arrows may also be used to indicate the direction in which a resource flows between systems. Thus, the resource flow from system S15 to system S26 is illustrated by a pipe connected to the right hand side of the box representing system S15 and the left hand side of the box representing system S26.

Importantly, database 300 identifies the resource flow between child systems S15 and S26 and summarizes the resource flow for the parent systems corresponding thereto. Thus, a resource flow from system S10 to system S21 is indicated by the boolean value of TRUE in the cell defined by the intersection of system S10 and system S21. Likewise, network diagram 500 illustrates the pipe connecting systems S15 and S26 as also connecting systems S10 and S21, which are represented as backdrops to systems S15 and S26 respectively. By summarizing the resource flows between parent systems for corresponding resource flows between child systems, the user has the ability to zoom in or zoom out to different layers in the taxonomy tree and, at any given layer, the network diagram depicts a resource flow between two parent systems if a resource flow exists between their respective child systems.

As discussed above with reference to FIG. 4, the hypercube illustrated therein defines a resource flow for the resource R1 from system S7 to system S9 and a resource flow for the resource R2 from system S4 to system S7. The network diagram of FIG. 5 provides the ability to distinguish between different resource flow, e.g., resource R1 and resource R2. For example, the resource flow R1 from system S7 to system S9 is depicted by the solid line 405, while the resource flow R2 from system S4 to system S7 is depicted by the dashed line 415.

It is appreciated that there are numerous ways to graphically discern in the network diagram between not only flows of different resources, but different characteristics for each resource flow, such as volume, rate, etc. By varying the type, width, color, etc., of a pipe connecting two systems together, the network diagram can effectively convey information about multiple resources. A user can choose to display one or more or all resources selected and maintained in database 300, at various layers of abstraction for the systems selected in the user defined taxonomy tree.

In the preferred embodiment of the present invention, a user may select a pipe representing a resource flow or box representing a system in the network diagram using, e.g., a keyboard or cursor control device, to display information regarding the selected resource or system. Items within the information displayed may also be selected to provide additional information. In this way, the network diagrams provides a graphical means for indexing and initiating access to information regarding resources and/or systems of interest stored in a database. In the database, information regarding systems is tagged with attribute expressions of systems with which the information is associated. Information about resource flows is tagged with the attribute expressions of the producing and consuming systems, and a resource identifier, which may be an attribute expression as well, with which the resource flow information is associated.

Merging Network Diagrams

The present invention enables the merging of diverse network diagrams as long as the network diagrams: 1) are based on the flow of resources (e.g., material, energy, information or other) between real-world systems (natural or artificial); 2) do not include false assumptions (such as "customers are never suppliers"); and, 3) include only direct resource flow lines that do not bypass intermediary systems.

To merge diverse network diagrams, the resources and systems depicted in the diagrams must be aggregates of one or more known resources or systems, with known and comparable attributes. As will be shown below, it may be necessary to obtain information about resources flowing within nodes in each network diagram to merge network diagrams representing network diagrams with different taxonomies and/or aggregations. It should be understood that a merged network diagram may be displayed as an extension of either of the original network diagrams or a new network diagram, depending upon the user defined taxonomy used in the creation of the merged network diagram. The primary difference between an original network diagram and a reconstituted display of the same generated from a database underlying the merged network diagram is the possible addition of a single system u representing one or more systems in a universal class not included in either of the original network diagrams.

Each of the network diagrams to be merged has its own underlying taxonomy tree of systems. Recall further that the systems represented as nodes in each of the network diagrams are connected together in accordance with one or more resources flowing between the systems (represented as pipes between the nodes in the network diagrams) as determined by their respective underlying hypercubes. The trees of systems may be identical, overlapping, or mutually exclusive with respect to each other. If the trees of systems are mutually exclusive, then the trees of systems are combined with a system u representing a universal tree of aggregate systems not found in either tree to form a new tree (unless the combination of both trees of systems includes all systems in the universal tree of systems, making this step unnecessary). Additionally, a new hypercube is formed combining the systems of both trees and system u and the resources of both original hypercubes.

If the trees of systems are overlapping, they necessarily share at least one system in common, in which case they are considered to be partially overlapping, and potentially share all systems in common, in which case they are considered to be completely overlapping. If the trees of systems are completely overlapping, then, just as described above in connection with mutually exclusive trees of systems, the trees of systems are combined with a system u representing a universal tree of aggregate systems not found in either tree to form a new merged tree, and a new hypercube is formed combining the systems of both trees and system u and the resources of both original hypercubes. However, duplicate systems in common between the trees are removed from the merged tree, as are the related cells in the new hypercube related thereto.

If trees of systems are partially overlapping, then new sub-systems are defined in each of the original taxonomy trees using new attributes to distinguish the sub-systems for each of the overlapping systems, thereby extending the original user defined taxonomy trees until all the systems are either mutually exclusive or exactly overlapping. Then, as is the case with completely overlapping trees of systems, the trees of systems are combined with a system u representing a universal tree of aggregate systems not found in either tree to form a new merged tree, a new hypercube is formed combining the systems of both trees and system u and the resources of both original hypercubes, and duplicate systems in common between the trees are removed from the merged tree, as are the related cells in the new hypercube related thereto.

In the process of extending the original user defined taxonomy trees, it may be necessary to expose resource flows that are internal to a system in the original network diagram(s) by gathering information not contained in the original diagram such as which sub-systems(s) of a system Sn receive the input of resource Rn, which sub-system(s) of system Sn contribute to the output of resource Rn, and, in what manner does resource Rn flow between the subsystems of system Sn.

There are criteria that can be used to decompose any two partially overlapping systems, e.g., system Sn and system Sm, if the taxonomy trees used to create the original network diagrams and the relevant attributes are known. In such network diagrams, system Sn will be an aggregate of all systems satisfying some attribute expression "nExpr" and similarly, system Sm will contain systems satisfying an attribute expression "mExpr". For any two systems Sn and Sm, whether or not the systems are partially overlapping, three subsystems may be defined:

subsystem 1: nExpr AND mExpr
subsystem 2: nExpr AND NOT mExpr
subsystem 3: mExpr AND NOT nExpr If system Sn and system Sm do not actually overlap at all, subsystem 1 is empty. If system Sm is completely contained by system Sn, subsystem 3 is empty. If system Sn is completely contained by system Sm, subsystem 2 is empty. If system Sn is equivalent to system Sm, then both subsystem 2 and subsystem 3 is empty. In any case, the taxonomy trees underlying the original network diagrams may be extended so that subsystems 1 and 2 appear as children of system Sn in one of the original network diagrams, and subsystems 2 and 3 appear as children of system Sm in the other original network diagram. The two extended network diagrams can then be merged as described above.

Conclusion

Although the present invention has been described in terms of specific exemplary embodiments and implementations, it is appreciated that various modifications or implementations might be made by those skilled in the art without departing from the spirit and scope of the invention as set forth in the following claims.

What is claimed is:

1. A method for creating a network diagram of a plurality of system objects comprising the steps of:

a. selecting the plurality of system objects from a plurality of classes;

b. selecting an attribute associated with the plurality of classes;

c. organizing the plurality of system objects into a plurality of groups according to the attribute;

d. selecting a resource that potentially flows between the plurality of groups;

e. identifying the plurality of groups between which the resource flows;

f. organizing the resource and the plurality of groups to identify between which of the plurality of groups the resource flows;

g. displaying a plurality of nodes each representing one of the plurality of groups; and, h. displaying a plurality of pipes corresponding to the resource connecting the plurality of nodes to form the network diagram.

2. A method for displaying resources flowing between a plurality of systems, comprising the steps of:

a. selecting objects from a plurality of objects in a memory of a computer system, the plurality of objects representing the plurality of systems;

b. organizing the objects into groups according to a first attribute shared among the objects;

c. organizing the objects in each of the groups into subgroups according to a second attribute shared among the objects in each of the groups;

d. linking the subgroups from different groups between which a resource flows;

e. linking the different groups having subgroups between which the resource flows; and f. displaying the resource flowing between the groups and subgroups.

3. A method for creating a network diagram of system objects and resource objects, comprising the steps of:

a. building an attribute table of system objects and associated attributes;

b. selecting resource objects from a resource objects data structure;

c. building a multidimensional data structure identifying between which of the system objects the resource objects flow; and d. creating the network diagram from the attribute table and multidimensional data structure.

4. The method of claim 3, wherein the step of building an attribute table of system objects and associated attributes further comprises the steps of:

a. selecting system objects from a database of system objects;

b. selecting attributes each associated with at least one of the system objects; and c. recursively separating the system objects into subsystem objects, each distinguished by one of the associated attributes selected.

5. The method of claim 3, wherein the step of building a multidimensional data structure identifying between which of the system objects the resource objects flow further comprises the steps of:

a. identifying subsystem objects corresponding to the system objects from which the resource objects flow;

b. identifying subsystem objects corresponding to the system objects to which the resource objects flow;

c. pairing the subsystem objects between which the resource objects flow;

d. maintaining a list of the subsystem object pairs;

e. pairing the system objects corresponding to the subsystem objects between which the resource objects flow; and f. maintaining a list of the system object pairs.

6. The method of claim 5, wherein the step of creating the network diagram from the attribute table and multidimensional data structure further comprises the steps of:

a. displaying the subsystem objects as nodes in the network diagram;

b. displaying the system objects from which the subsystem objects were separated as backdrops to the subsystem objects; and c. displaying the resource objects as pipes connecting the subsystem objects and corresponding system objects between which the resource objects flow.

\* \* \* \* \*